United States Patent
Hellberg

(10) Patent No.: US 6,897,721 B2
(45) Date of Patent: May 24, 2005

(54) COMPOSITE AMPLIFIER WITH OPTIMIZED LINEARITY AND EFFICIENCY

(75) Inventor: Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 32 days.

(21) Appl. No.: 10/476,002

(22) PCT Filed: Mar. 27, 2002

(86) PCT No.: PCT/SE02/00606

§ 371 (c)(1),
(2), (4) Date: Oct. 27, 2003

(87) PCT Pub. No.: WO02/095933

PCT Pub. Date: Nov. 28, 2002

(65) Prior Publication Data

US 2004/0135630 A1 Jul. 15, 2004

(30) Foreign Application Priority Data

May 18, 2001 (SE) .............................. 0101774

(51) Int. Cl.[7] .............................................. H03F 1/30
(52) U.S. Cl. .................... 330/149; 330/124 R; 330/304
(58) Field of Search ............................ 330/149, 124 R, 330/304

(56) References Cited

U.S. PATENT DOCUMENTS

| | | | |
|---|---|---|---|
| 5,880,633 A | 3/1999 | Leizerovich et al. | |
| 5,901,346 A | 5/1999 | Stengel et al. | ............... 455/126 |
| 6,097,252 A | 8/2000 | Sigmon et al. | |
| 6,262,629 B1 | 7/2001 | Stengel et al. | |
| 6,396,341 B1 | 5/2002 | Pehlke | ......................... 330/10 |
| 6,731,173 B1 | 5/2004 | Thompson | ................... 330/296 |
| 6,765,440 B2 | 7/2004 | Chandrasekaran | ........... 330/149 |

*Primary Examiner*—Patricia Nguyen
(74) *Attorney, Agent, or Firm*—Nixon & Vanderhye P.C.

(57) ABSTRACT

The invention relates to a composite amplifier (500) based on a main amplifier (510) and an auxiliary amplifier (520), and compensation for non-linear amplifier behavior by means of respective non-linear models (570, 575) of parasitic. In order to provide proper excitation of the non-linear models, a filter network (560) based on a linear model of the output network of the composite amplifier is provided. The linear filter network (550) basically determines ideal output node voltages, which are used as input to the respective non-linear models for generating appropriate compensation signals. The compensation signals are finally merged into the input signals of the respective sub-amplifiers (510, 520), thus effectively compensating for the effects of the non-linear parasitics.

20 Claims, 7 Drawing Sheets

US 6,897,721 B2

COMPOSITE AMPLIFIER WITH OPTIMIZED LINEARITY AND EFFICIENCY

This application is the U.S. national phase of international application PCT/SE02/00606, filed Mar. 27, 2002, which designated the U.S.

TECHNICAL FIELD OF THE INVENTION

The present invention generally relates to composite amplifiers and more particularly to techniques for optimizing the linearity as well as efficiency of such amplifiers.

BACKGROUND OF THE INVENTION

In cellular base stations, satellite communication systems as well as other communication and broadcasting systems of today, it is often desirable to amplify multiple radio frequency (RF) channels simultaneously in the same power amplifier instead of using a dedicated power amplifier for each channel. However, when using one and the same power amplifier for the simultaneous amplification of multiple RF channels spread across a fairly wide bandwidth, a high degree of linearity is required so that the phases and amplitudes of all the signal components are preserved in the amplification process.

If the linearity is inadequate, the simultaneously amplified channels cross-modulate, causing interference in these and other channels. The non-linearities manifest themselves as cross-modulation of different components of the signal, leading to leakage of signal energy to undesired channels. In addition, the spectra of the signal components are normally broadened, causing additional interference within the channels or in other channels.

In addition to linearity, one of the most important properties of a power amplifier is efficiency. The efficiency must be kept high in order to reduce the need for cooling as well as the overall power consumption, and to increase the lifetime of the amplifier.

Consequently, the problem of enhancing the linearity must be solved without sacrificing the amplifier efficiency.

A common way of increasing the efficiency of an RF power amplifier is to use the Doherty principle as described and developed in references [1–7]. FIG. 1 is a schematic block diagram of a conventional Doherty amplifier. The Doherty amplifier 100 is a so-called composite amplifier, which in its basic form comprises two sub-amplifier stages, a main amplifier 110 and an auxiliary amplifier 120. The auxiliary amplifier 120 is connected directly to the load 130, and the main amplifier 110 is connected to the load through an impedance inverter 140, usually in the form of a quarter wavelength transmission line or an equivalent lumped network At low output levels, only the main amplifier 110 is active. In this region, the main amplifier 110 sees a higher (transformed) load impedance than the impedance at peak power, which results in increased efficiency. The input drive arrangement 150 of the auxiliary amplifier 120 is configured with a non-linear drive function f2(x) such that when the output level climbs over the so-called transition point (usually half the maximum output voltage), the auxiliary amplifier kicks in, starting to drive current into the load 130. Through the impedance-inverting action of the quarter wave transmission line 140, the effective impedance at the output of the main amplifier 110 is reduced such that the main amplifier is kept at a constant maximum voltage above the transition point. The key action of the Doherty amplifier occurs in the region where the auxiliary amplifier 120 is active, and the main amplifier 110 is close to its maximum voltage condition, with high overall efficiency as a result.

However, conventional Doherty amplifiers only provide satisfactory linear performance and efficiency in a relatively narrow frequency band. The quarter wavelength impedance inverter provides a phase shift of 90 degrees only at a single frequency, and the output of a practical Doherty amplifier will be distorted at frequencies away from this so-called center frequency because of a reflection of the output current of the auxiliary amplifier at the impedance inverter. Losses in the transistors, the impedance inverter and the DC feed networks may also give rise to unexpected distortion. In addition to these sources of distortion, Doherty amplifiers will in practice always suffer from non-linearities caused by non-linear output parasitic elements such as parasitic conductances and capacitances, commonly referred to as parasitics.

It is generally known that the non-linearities encountered in Doherty amplifiers are strongly frequency-dependent. The non-linearities will manifest themselves both as (modulated) harmonic overtones and intermodulation products. The intermodulation products are the most severe for communication systems since the harmonic overtones can be filtered away before the signal reaches the antenna. The intermodulation products on the other hand appear right among the desired signals and can generally not be filtered away before transmission. The complex frequency dependency makes it very difficult to compensate for the non-linear intermodulation products by using pre-distortion. Simple pre-distortion techniques can not compensate for these non-linearities. In fact, a very complex and hence expensive pre-distorter implemented with digital signal processing (DSP) techniques will be required. Such a complex pre-distorter is furthermore difficult to adjust properly and will generally not optimize the efficiency.

Consequently, there is a general demand for an improved technique of compensating for non-linearities in a composite amplifier.

RELATED ART

Reference [8] discloses a circuit technique for canceling non-linear capacitor-induced harmonic distortion in a single amplifier. The amplifier transistor is associated with a non-linear capacitance that produces an undesirable non-linear current. An additional compensating transistor that has a similar non-linear capacitance is used together with a current mirror to produce a correction current that cancels the undesirable non-linear current.

SUMMARY OF THE INVENTION

It is a general object of the present invention to improve the linearity of a composite amplifier.

It is a particular object of the invention to compensate for non-linearities in a composite amplifier, especially those caused by parasitics in the amplifier.

These and other objects are met by the invention as defined by the accompanying patent claims.

The general idea according to the invention is to emulate and compensate for a non-linear amplifier behavior based on a non-linear model of a parasitic, using a linear model of the output network of the composite amplifier to provide proper excitation of the non-linear model.

A careful analysis of the composite amplifier and the involved parasitics reveals that the parasitics are highly dependent on the output node voltages of the sub-amplifiers within the composite amplifier and that "ideal" output node voltages can be determined based on a linear model of the output network of the composite amplifier. By determining the output node voltages and using them as input to respective models of non-linear, voltage-dependent parasitics, appropriate compensation signals are emulated. The emulated compensation signals are then merged into the input signals of the respective sub-amplifiers, thus effectively compensating for the effects of the non-linear parasitics.

It should be understood that the invention is not restricted to parasitics, but can be used to compensate for any non-linear amplifier behavior that can be modeled as a non-linear parasitic.

It has also been shown that the non-linear output current of the auxiliary sub-amplifier in a Doherty-type composite amplifier not only generates a desired voltage at the main sub-amplifier, but also ends up as distortion in the output of the composite amplifier, mainly due to the reflection of the non-linear output current of the auxiliary amplifier at the impedance inverter. In many cases, this distortion is much more severe than the distortion caused by non-linear parasitics.

Therefore, according to a preferred embodiment of the invention, the proposed compensation technique based on non-linear modeling of parasitics is combined with a technique for linearly compensating for the distortion that the non-linear output current of the auxiliary amplifier causes at the output. Preferably, the non-linear output current from the auxiliary sub-amplifier is emulated based on a linear output network model and merged into the input signal of the main sub-amplifier, thus effectively compensating for this large-scale type of distortion caused by the reflection of the non-linear output current at the impedance inverter.

The invention offers the following advantages:

Enhanced linearity, without sacrificing amplifier efficiency;

Compensation for complicated frequency-dependent non-linearities; and

Simple and effective implementation.

Other advantages offered by the present invention will be appreciated upon reading of the below description of the embodiments of the invention.

BRIEF DESCRIPTION OF THE DRAWINGS

The invention, together with further objects and advantages thereof will be best understood by reference to the following description taken together with the accompanying drawings, in which.

DETAILED DESCRIPTION OF EMBODIMENTS OF THE INVENTION

Composite amplifiers can be found in various applications in many fields of technology such as consumer electronics, radar technology and radio communication. In the following, the invention will be described with reference to a particular application within the field of radio communication. It should though be understood that the invention is not limited thereto, and that other applications are feasible as well.

Figure 1:
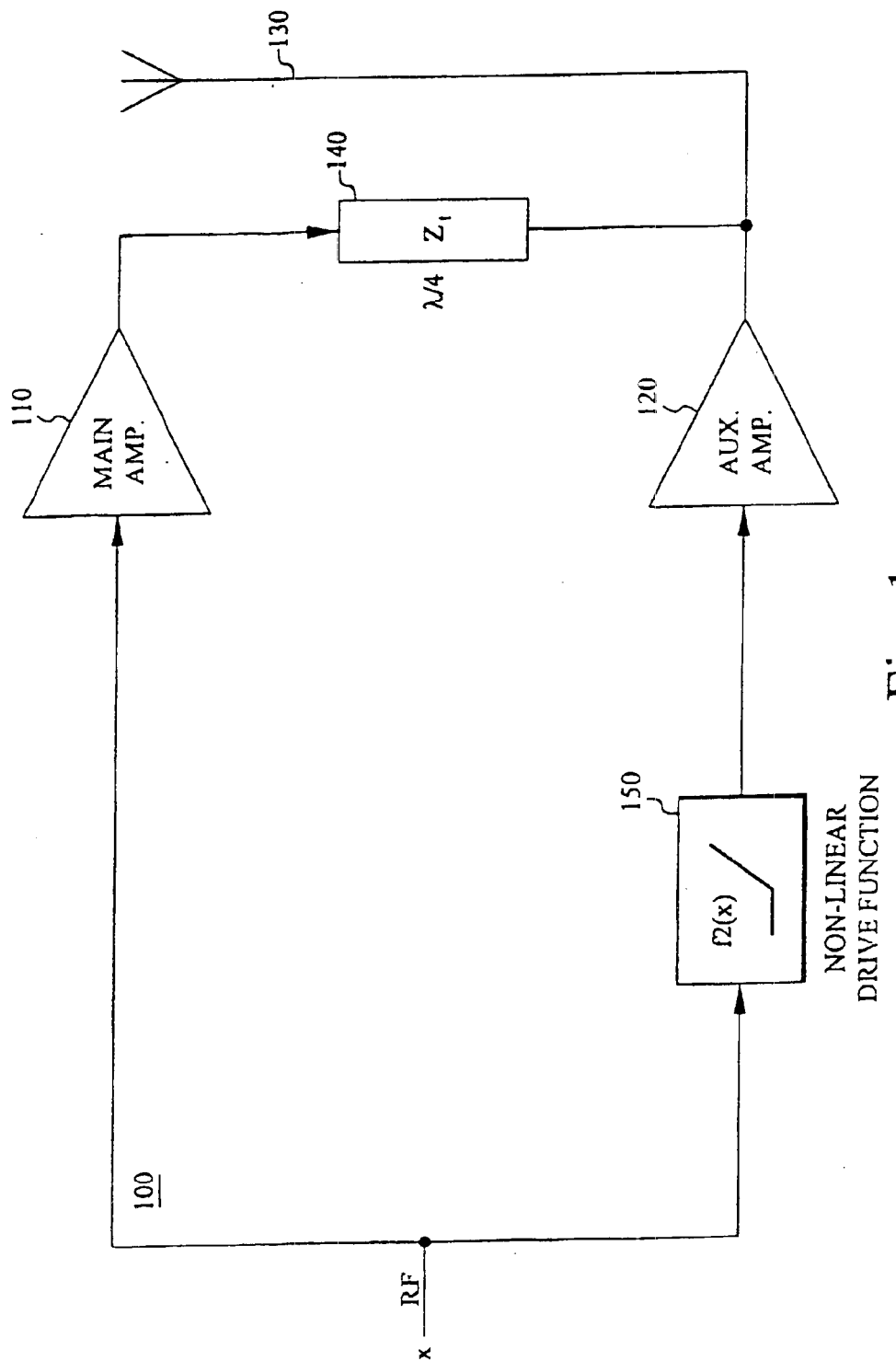
FIG. 1 is a schematic block diagram of a conventional Doherty amplifier.
Figure 2:
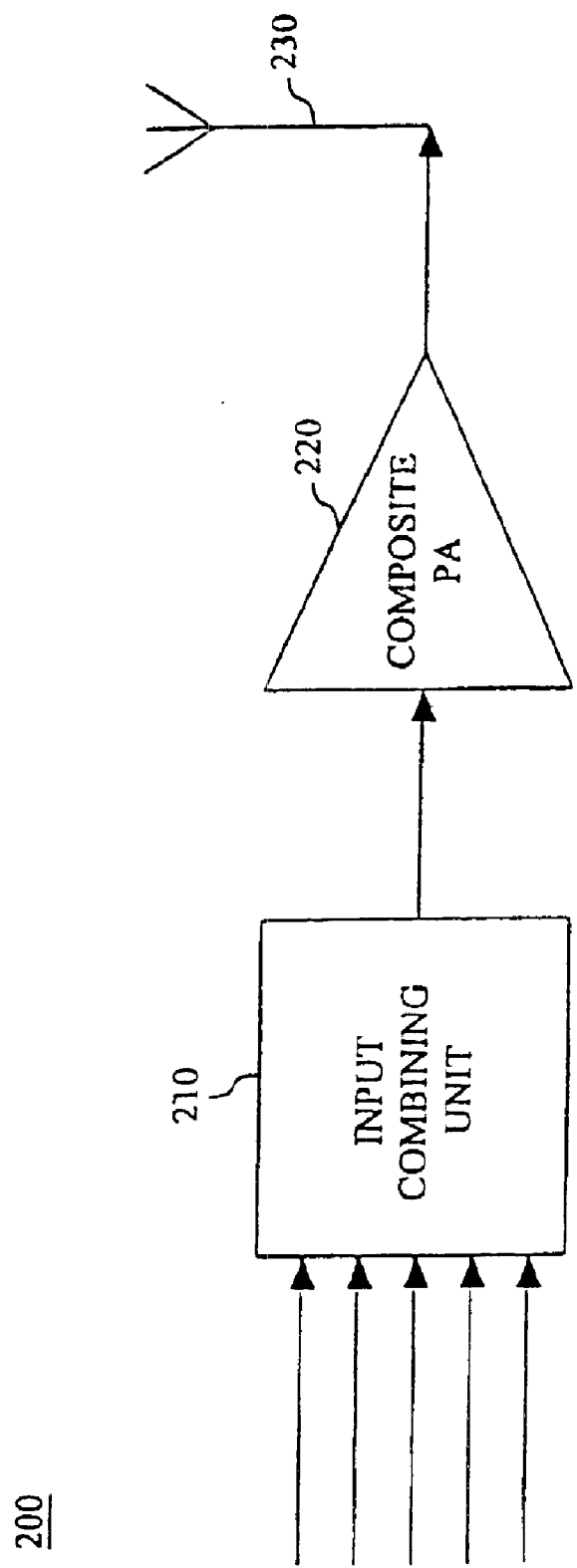
FIG. 2 is a schematic high-level block diagram of a radio transmitter based on a composite power amplifier.

In a typical radio application, as schematically illustrated in the high-level block diagram of FIG. 2, a composite power amplifier is arranged in a radio transmitter for simultaneous amplification of several narrow-band channels. In a very basic realization, the transmitter 200 comprises a general input unit 210 for combining the input signals into a complex multi-channel signal, a composite power amplifier (PA) 220 for simultaneous amplification of the multiple channels and a transmission element 230. Such a basic realization of course requires that the input signals are modulated RF signals within the desired target frequency band. If the input signals are base-band signals, up-conversion to the radio frequency band is also required. The transmitter illustrated in FIG. 2 is adapted for amplification and transmission of for example several FDMA/TDMA carrier waves, but can easily be modified for amplification and transmission of a carrier wave on which several CDMA channels are superimposed, or for multi-level linear modulation formats.

In order to preserve the phases and amplitudes of all the signal components in the amplification process and to prevent leakage of interfering signal energy between the channels, a high degree of linearity is required in the composite amplifier. In this respect, it has turned out to be particularly difficult to eliminate the effects of non-linear parasitics in the composite amplifier.

In general, non-linear parasitics in a composite amplifier end up as complex frequency-dependent non-linearities in the output that can not be compensated for by simple pre-distortion techniques. The problem is mainly caused by the fact that some transistor node voltages, especially the drain (FET implementation) or collector (BJT implementation) voltages of the involved transistors, are required to be non-linear by a desired non-linear shaping in order to maximize efficiency even when the composite amplifier output should be perfectly linear. It has been shown that the parasitics are highly dependent on these output node voltages, and that the interaction of these non-linear node voltages with the non-linear parasitics in a composite amplifier will cause strongly frequency-dependent non-linearities in the output as well as sub-optimal efficiency. This complex frequency dependence makes it very difficult to compensate for the non-linearities by using pre-distortion.

Figure 3:
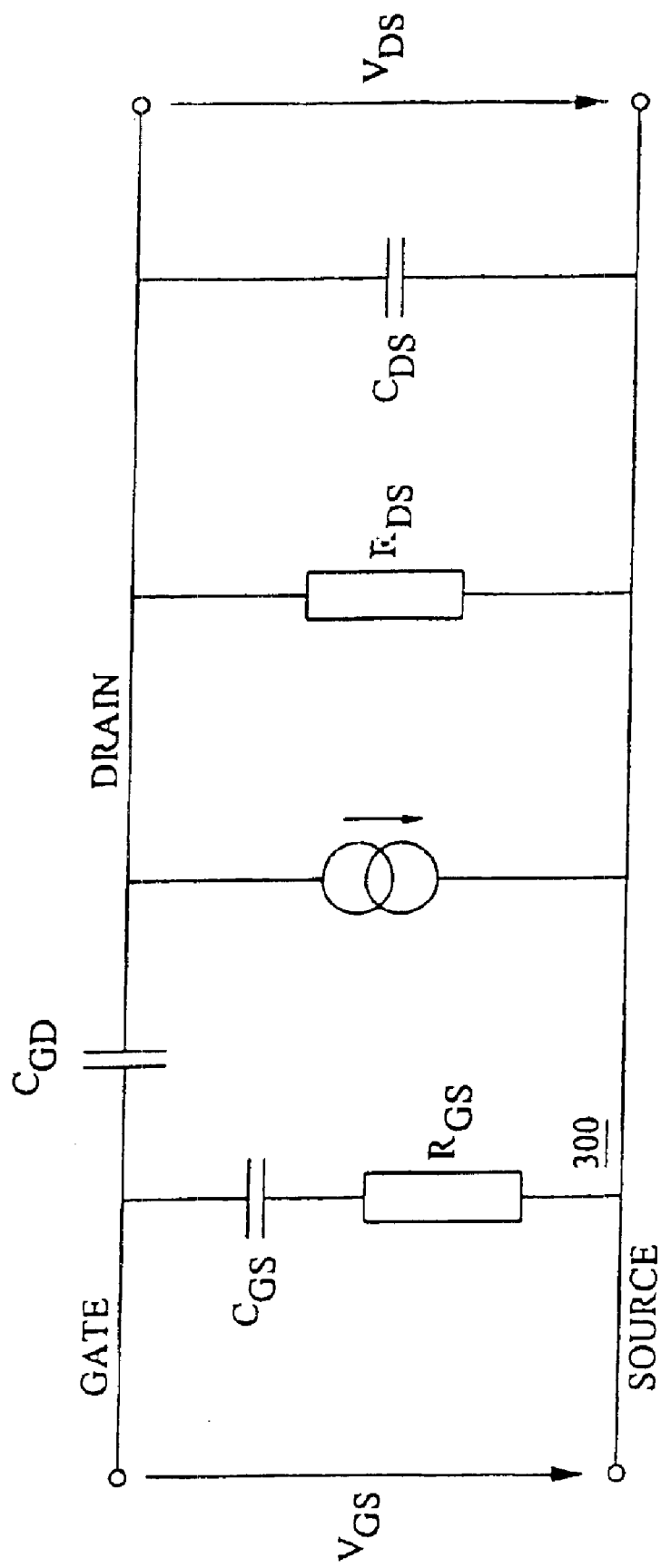
FIG. 3 is a schematic high-frequency model of a field-effect transistor (FET), including parasitic elements.

FIG. 3 is a schematic high-frequency model of a field-effect transistor (FET), including parasitic elements. The transistor 300 is a conventional FET with gate, source and drain terminals. The most important parasitics are generally the drain-source capacitance $C_{DS}$ and the drain-source resistance $R_{DS}$, which cause non-linearities with a complicated frequency dependence in the output when they interact with the drain-source output voltage $V_{DS}$.

Since the parasitics, as discussed above, are dependent on the output node voltages of the sub-amplifiers within the composite amplifier, it is desirable to analyze the voltage behavior at these nodes. For this purpose, a linear model of the output network of the composite amplifier is used.

Figure 4:
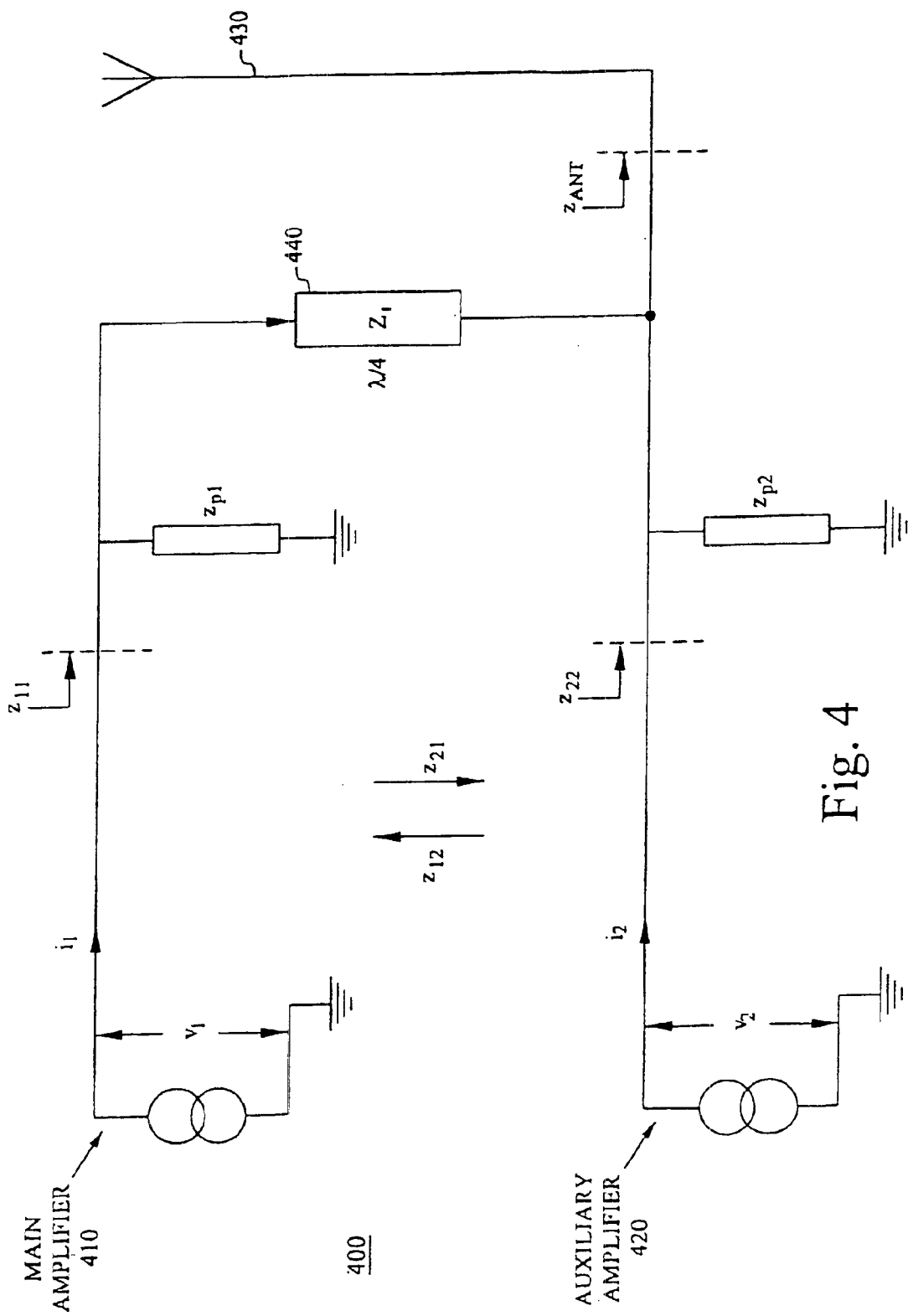
FIG. 4 illustrates a linear model of the output network of a Doherty-type composite amplifier.

FIG. 4 illustrates a linear model of the output network of a Doherty-type composite amplifier. In this model of the output network 400, the active part of the transistor output of each of the sub-amplifiers 410, 420 is modeled as linear controlled current generator. The finite output conductances of the transistors, together with possible reactances, are lumped together as $z_{p1}$ and $z_{p2}$, respectively. The impedances presented to the current generator output nodes are defined as:

$$z_{11} = \frac{v_1}{i_1}\bigg|_{i_2=0} \quad z_{22} = \frac{v_2}{i_2}\bigg|_{i_1=0} \quad (1)$$

Similarly, the transimpedances (the voltage at the inactive amplifier output in response to an output current at the active amplifier) are defined as:

$$z_{21} = \frac{v_2}{i_1}\bigg|_{i_2=0} \quad z_{12} = \frac{v_1}{i_2}\bigg|_{i_1=0} \quad (2)$$

Assuming that all components are reasonably linear, superposition can be used for analyzing this model. The composite amplifier output voltage at the antenna 430 is here assumed to be the same as the output voltage at auxiliary amplifier 420, although in reality there can be a feeder cable, filters, etc. separating the actual antenna and the amplifier output. The combined effect of all these elements is included in the antenna (output) impedance, $z_{ANT}$. The transistor feedback impedances (mainly due to gate-drain capacitances) are neglected. This is perfectly valid if the feedback is small.

Based on the presented linear model of the output network, the output node voltages can be determined as:

$$v_1 = z_{11} \cdot i_1 + z_{12} \cdot i_2 \quad (3)$$

$$v_2 = z_{22} \cdot i_2 + z_{21} \cdot i_1 \quad (4)$$

By applying the determined output node voltages to respective models of non-linear voltage-dependent output parasitics, the non-linear behavior of the parasitics in the corresponding outputs can be emulated. By merging the emulated output behavior of the parasitics into the respective input signals to the sub-amplifiers, the effects of the non-linear output parasitics can be compensated for.

Figure 5:
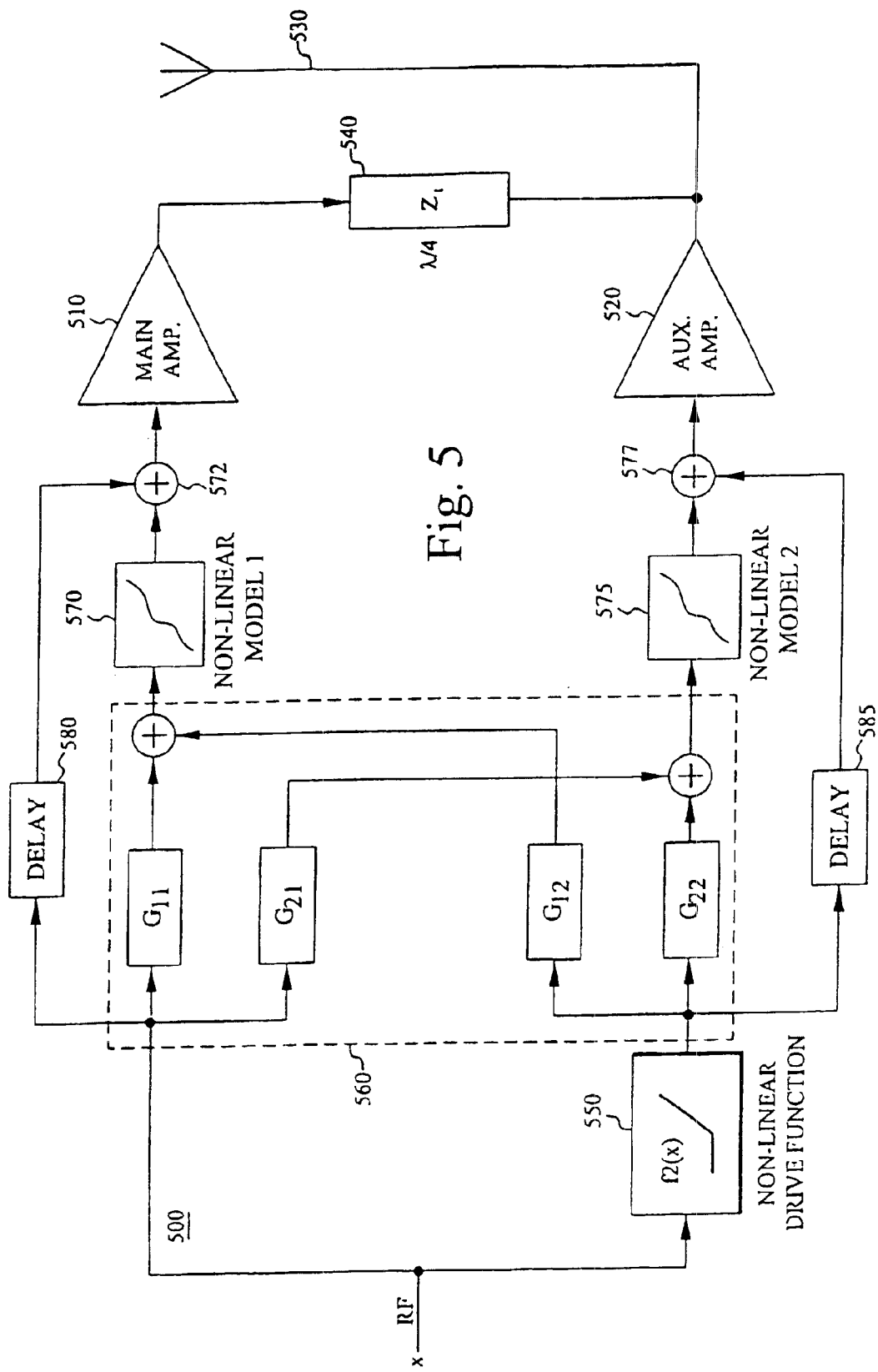
FIG. 5 is a schematic block diagram of a composite power amplifier with non-linear compensation for parasitics according to an illustrative embodiment of the invention.

FIG. 5 is a schematic block diagram of a composite power amplifier with non-linear compensation for parasitics according to an illustrative embodiment of the invention. The composite amplifier 500 basically comprises a main amplifier 510, an auxiliary amplifier 520, a load 530 in the form of an antenna, an impedance inverter 540, and an input drive arrangement 550 for the auxiliary amplifier. In order to emulate the non-linear behavior of output parasitics present in the composite amplifier, a filter network 560 is introduced together with respective non-linear parasitic models 570, 575.

In this embodiment, the filter network 560 is implemented according to expressions (3)–(4) above with the filters $G_{11}$–$G_{22}$ emulating the impedances and transimpedances of the output network of FIG. 4:

$$G_{11} = z_{11} \quad (5)$$

$$G_{12} = z_{12} \quad (6)$$

$$G_{21} = z_{21} \quad (7)$$

$$G_{22} = z_{22} \quad (8)$$

The filter network 560 basically determines the "ideal" (without non-linear parasitics) transistor output node voltages. The determined output node voltages are then applied to the non-linear models 570 and 575, respectively, to emulate the currents through the parasitics. By using the emulated currents as compensation currents and adding them to the original input currents in the adder elements 572, 577, the effects of the non-linear parasitics are effectively cancelled. In order to synchronize of the original current signals with the emulated compensation currents, delay elements 580, 585 are used.

This technique offers a relatively simple way of reducing complicated frequency-dependent non-linearities due to non-linear parasitics in composite amplifiers. Since the technique is based on thorough knowledge of how composite amplifiers actually work, it can replace other more complicated linearization techniques with simpler and more effective implementations.

The models of the non-linear parasitics, non-linear model 1 and non-linear model 2, may be realized as frequency-independent, memory-less models, using simple look-up tables based on empirical measurements on real parasitics to emulate the non-linear behavior of the output parasitics. This approach is perfectly reasonable when the output parasitics are mainly in the form of (non-linear) conductances or when the bandwidth is relatively small. In most cases, the frequency-dependent non-linearities in the output can be minimized by careful separation of the linear and non-linear parts in the model. If this is not sufficient, frequency-dependent adaptive models are used. Any suitable adaptive algorithm such as the well-known LMS (Least Mean Sqaure) algorithm or the RLS (Recursive Least Square) algorithm can be used to adjust the non-linear models so that the error component at the output is minimized. Frequency-dependent models can be adapted in the same way, keeping in mind that these models include a memory component, and can generally be seen as non-linear or linear filters.

Although there may be several output parasitics that affect the linearity of the output, it is possible to use a model of a single parasitic to emulate the non-linear amplifier behavior at a given node. For example, all non-linear parasitics at an output node may be grouped into a single complex-valued parasitic. Alternatively, only the dominant output parasitic is modeled. The parasitics usually encountered in practice are non-linear conductances and capacitances, but the technique is not restricted to these parasitics. In fact, the technique is not even restricted to parasitics, but can be used to compensate for any non-linear amplifier behavior that can be modeled as a non-linear parasitic. An important example is the compression behavior due to saturation, which largely can be described by a non-linear drain-source impedance when it comes to its effect on the output.

It is furthermore important to understand that the proposed compensation technique does not necessarily have to be used in all the branches of the composite amplifier, but can be applied to only a single branch to compensate for the non-linear parasitics encountered in the sub-amplifier of that branch. This is particularly useful if the parasitics of a specific transistor are much more dominant in generating distortion than the parasitics of the other transistor(s) in the composite amplifier. The cost for implementing the technique can then be greatly reduced, while most of the distortion is still corrected for.

A careful analysis of Doherty-type composite amplifiers has also revealed that the non-linear output current of the so-called auxiliary sub-amplifier not only generates a desired voltage at the main sub-amplifier, but also ends up as distortion in the output of the composite amplifier, mainly due to reflection of the non-linear output current at the impedance inverter. The impedance inverter provides a phase shift of 90 degrees only at a single so-called center frequency and has a growing (chiefly reactive in the lossless case) impedance at frequencies away from the center frequency. In practice, there will always be a reflection of the non-linear current from the auxiliary amplifier at the impedance inverter since the linear output network impedance $z_{22}$ (see FIG. 4) has a strongly frequency-dependent reactive part in a practical realization. This means that the output will be distorted at frequencies away from the center frequency. This distortion is present even if all components are linear and lossless, since it is due to the reflection of the non-linear output current of the auxiliary amplifier at the impedance inverter. The resulting voltage shows up as a strongly frequency-dependent non-linear component in the amplified output signal.

Losses in the transistors, impedance inverters and the DC feed networks also give rise to unexpected distortion. This is because these losses make the impedance at the impedance inverter, as seen from the auxiliary amplifier, resistive instead of the ideal short-circuit (a lossless quarter wavelength transmission line loaded with the infinite impedance of a current generator is a short-circuit at center frequency). The distortion in the output caused by these losses are due to the same type of reflection (but now resistive instead of reactive) of the non-linear current from the auxiliary amplifier at the impedance inverter which caused the frequency-dependent distortion mentioned above.

In many cases, especially for wide-band linear applications, this distortion is much more severe than the distortion caused by non-linear parasitics, and therefore it is highly recommendable to try to compensate for this type of distortion as well. The invention proposes a linear technique for compensating for the distortion that the non-linear output current of the auxiliary amplifier causes at the output. Preferably, the non-linear output current from the auxiliary amplifier is emulated based on a linear output network model and merged into the input signal of the main sub-amplifier, thus effectively compensating for distortion caused by the reflection of the non-linear output current at the impedance inverter.

Figure 6:
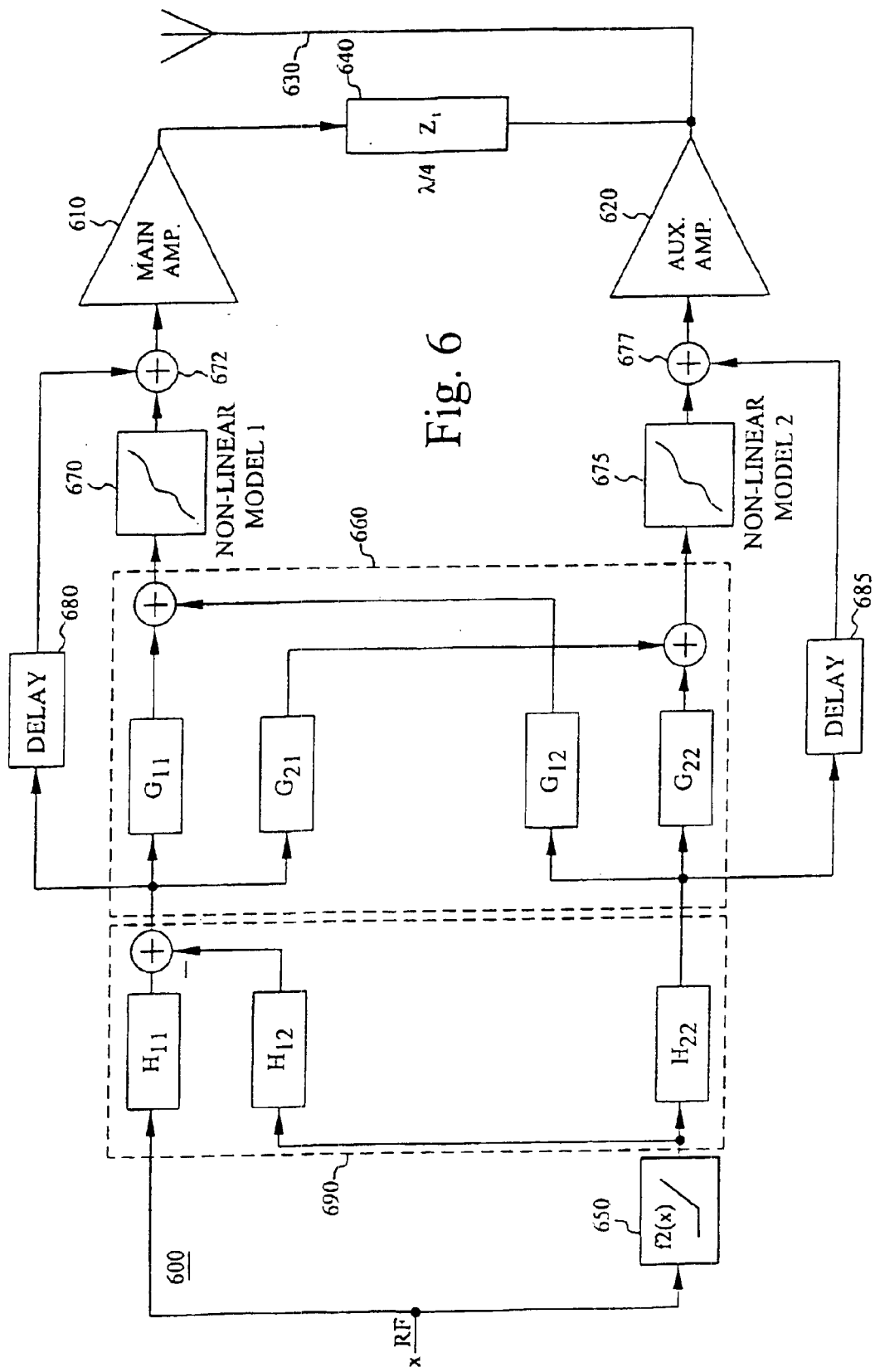
FIG. 6 is a schematic block diagram of a composite power amplifier with non-linear compensation for parasitics in combination with compensation for the non-linear output current of the auxiliary amplifier according to an illustrative embodiment of the invention.

FIG. 6 is a schematic block diagram of a composite power amplifier with compensation for parasitics in combination with compensation for the non-linear output current of the auxiliary amplifier according to an illustrative embodiment of the invention. The power amplifier 600 shown in FIG. 6 is similar to that of FIG. 5, except for an additional filter network 690 for linear compensation.

In the present solution, the parasitics at each transistor output node are preferably separated into two parts, a linear part and a residual non-linear part. All non-linear parts of the parasitics at a node are conveniently grouped into a single complex-valued non-linear parasitic. The non-linear part of the parasitics at each node are compensated for in the same manner as described above by means of the filter network 660 in combination with the models 670, 675 of the non-linear parts of the parasitics and the adder elements 672, 677. The rest of the output network of the composite amplifier, including the linear part of the parasitics, is modeled and used for calculating linear compensations in the additional filter network 690.

In a reduced realization, the filter network 690 is provided in the form of a single filter block $H_{12}$ which is a cross-coupling filter that compensates for the non-linear output current of the auxiliary amplifier.

Referring once again to the linear output network model of FIG. 4, the non-zero impedance $z_{22}$ will reflect any current $i_2$ from the auxiliary amplifier as a voltage, and this voltage will be found in the output. If the current $i_2$ was a linear representation of the desired signal, this would not be a problem. However, in Doherty and similar amplifiers, this current is a very non-linear function of the desired signal due to input drive function f2(x). The non-ideal impedance $z_{22}$ thus makes the amplifier output non-linear.

By cross-coupling a copy of this non-linear signal ($i_2$ filtered by impedance $z_{22}$) to the main amplifier in anti-phase, the distortion at the output will be cancelled effectively. Since the transimpedance $z_{21}$ is the main linear channel from the main amplifier to the output, the compensation to the input of main amplifier will linearly transform into a cancellation signal in the output slightly filtered by $z_{21}$. The filtering effect of the transimpedance $z_{21}$ should therefore be compensated for in the cross-coupled compensation signal for everything to cancel perfectly.

Thus, the cross-coupling filter $H_{12}$ in a reduced realization of the filter network 690 of FIG. 6 may be represented by:

$$H_{12} = z_{22} * z_{21}^{-1} \qquad (9)$$

where "*" denotes multiplication in the frequency domain or convolution in the time domain. As can be seen in FIG. 6, the cross-coupled signal is then subtracted from the input signal to main amplifier.

Alternatively, instead of cross-coupling the non-linear drive function f2(x) through a cross-coupling filter $H_{12}$, the same effect can be accomplished by duplicating the non-linear drive function f2(x) in the upper branch to the main amplifier, using the same filter block $H_{12}$ for compensation.

In a more elaborate realization, the filter network 690 also includes equalizing filter blocks $H_{11}$ and $H_{22}$ as well as an equalizing filter function in the filter block $H_{12}$ for providing an equalized frequency response. Since the primary function of the auxiliary amplifier in a Doherty amplifier is to keep the voltage at the main amplifier below saturation, the frequency dependency of all signals at the output of main amplifier should be as flat (equalized) as possible.

In the following, reference will frequently be made to currents, impedances and transimpedances originating from the linear output network model of FIG. 4, and the following description aims at providing an understanding of how these quantities can be used for providing optional frequency equalization in the composite amplifier of FIG. 6.

For the linear component (which constitutes all of $i_1$ of an uncompensated amplifier) equalization is achieved by means of an input filter with the frequency characteristics of $z_{11}^{-1}$, i.e. the inverse filter of the impedance seen at the output of main amplifier.

For the non-linear component due to $i_2$, which is filtered through the transimpedance $z_{12}$, and the non-linear part of $i_1$ that represents the cross-coupled distortion-canceling signal, which is filtered by $z_{11}$, the total should have a flat frequency characteristic (not just in magnitude, but also in phase). Since the non-linear component is formed by two parts, which are differently filtered, and the requirement for distortion-cancellation at the output dictates a certain relationship between the frequency characteristics of these signals, they should both be additionally filtered by the inverse of a special composite filter. Assuming that the raw non-linear function f2(x) has been filtered by $z_{22} * z_{21}^{-1}$ in $H_{12}$ for the cross-coupled part of $i_1$ and by nothing for the auxiliary amplifier part (except for gain), the total composite non-linear part is represented by:

$$\underbrace{f2(x)*z_{12}}_{i_2 \text{ part}} - \underbrace{f2(x)*z_{22}*z_{21}^{-1}*z_{11}}_{\text{cross-coupled part}} = f2(x)*\underbrace{(z_{12} - z_{22}*z_{21}^{-1}*z_{11})}_{\text{composite part}} \quad (10)$$

Thus, the extra equalizing filtering to these signals should have a frequency response defined as the inverse of the composite part:

$$(z_{12}-z_{22}*z_{21}^{-1}*z_{11})^{-1} \quad (11)$$

So far, nothing has been said about the magnitudes of the currents and voltages in the system except for their relation to each other. For the lossless case and at (near) the center frequency of the quarter-wave line, the traditional Doherty equations suffice. For extracting the most power from the chosen transistors, at least one of the transistors should be operating at its maximum current $I_{max}$. The voltages at peak power should also be the maximum allowed voltage $V_{max}$ (possibly with a safety margin). For a class B amplifier, the optimal load $R_{opt}$ is $V_{max}/I_{max}$. For an ideal Doherty amplifier the optimal load impedance depends on the transition point $\alpha$, such that $R_o = R_{opt}(1-\alpha)$.

For transition points $\alpha$ below 0.5, the current $i_1$ should in the ideal lossless, narrow-band case vary linearly with the signal amplitude and be equal to $I_{max}(1-\alpha)$ at the peak amplitude. Current $i_2$ should instead be zero for output voltages below the transition point, and above the transition point vary as the (normalized) amplitude minus $\alpha$ divided by $(1-\alpha)$. This means that auxiliary amplifier delivers current $I_{max}$ at peak amplitude. For transition points above 0.5 (which is very unlikely for optimized multi-carrier cases), $i_1$ would instead amount to $I_{max}$ at peak amplitude, and $i_2$ would maximally be $I_{max}(1-\alpha)/\alpha$.

The filters applied to the non-linear function f2(x) also have the dimension of current. In practice this is achieved by generating the appropriate drive voltage to the transistors, which act as transconductances, so that the end result is the desired current output. In the lossless case without frequency compensation, the filter applied to f2(x) for obtaining $i_2$ is simply a multiplication by $j*I_{max}$ (90 degrees phase shift). The maximum amplitude of the function f2(x) is here assumed equal to one. The cancellation term is then f2(x) filtered by $-j*I_{max}*z_{22}*z_{21}^{-1}$. The compensation $(z_{12}-z_{22}*z_{21}^{-1}*z_{11})^{-1}$ for achieving a frequency-independent non-linear voltage at the main amplifier can be multiplied to these two expressions in normalized and dimensionless form.

The expression for obtaining the linear part of $i_1$ already compensates for losses. The expressions for the non-linear parts must be modified to do so. Since the relation between the two non-linear currents is already established, this is achieved by modifying the magnitude (gain) of both parts equally, so that the amplitude of the suppression voltage at the main amplifier has the same slope as the linear part. The factor to multiply with is $V_{max}/\alpha$ divided by $(z_{12}-z_{22}*z_{21}^{-1}*z_{11})*j*I_{max}/(1-\alpha)$. The numerator and denominator are the voltage rise per normalized amplitude for the voltage at the main amplifier due to the linear part of $i_1$ and the non-linear currents, respectively. The denominator represents the voltage rise when the current magnitude derived for the narrow-band, lossless case is used. One thing to note here is that the compensation $(z_{12}-z_{22}*z_{21}^{-1}*z_{11})^{-1}$ for achieving a frequency-independent non-linear voltage at the main amplifier is automatically included in this "new" compensation. Thus, in hindsight the normalization is actually not necessary.

The analytical expressions for obtaining $i_2$ and $i_1$ are thus:

$$i_2 = \frac{V_{\max}(1-\alpha)}{\alpha}(z_{12} - z_{11}*z_{22}*z_{21}^{-1})^{-1} * f2(x) \quad (12\text{-}14)$$

$$i_{1,\text{nonlinear part}} = -\frac{V_{\max}(1-\alpha)}{\alpha}\underbrace{(z_{12} - z_{11}*z_{22}*z_{21}^{-1})^{-1}}_{\text{Equalizing part}} * \underbrace{z_{22}*z_{21}^{-1} * f2(x)}_{\substack{\text{Distortion-}\\\text{cancelling part}}}$$

$$i_{1,\text{linear part}} = \frac{V_{\max}}{\alpha}z_{11}^{-1}*x$$

The procedure for the lossy, wide-band case is more complicated. The limitations for the currents and voltages are the same as for the narrow-band lossless case, but the statistical nature of the wide-band signals makes it hard to obtain analytical expressions for them. The voltages will then depend on the bandwidth used, the amplitude distribution and phase relations of the individual carriers of the signal. The lossy, narrow-band case can however provide a starting point, from where adjustments can be made for the specific signals encountered.

In the lossy case the filter for obtaining the linear part of $i_1$, as applied to the dimensionless input signal x, will be $V_{max}/\alpha*z_{11}^{-1}$. The physical meaning of this filter is to generate the current $i_1$ such that the voltage at the output of the current generator of the main amplifier reaches $V_{max}$ at the normalized input amplitude $\alpha$ when the impedance seen by this current generator is $z_{11}$. When observed in the frequency domain, the term $z_{11}^{-1}$ (the inverse filter of the impedance $z_{11}$) is equal to $1/z_{11}$.

As previously, if the dimensionless signals f2(x) and x are represented in the time domain, "*" represent convolution in the time domain. If they are represented in the frequency domain, the symbol instead represents multiplication of frequency responses, and the multiplication with inverse filters can be written as a division by the filter instead. The j and -j factors have vanished from the expressions, but in reality the phases of the currents are about the same as before. The imaginary units are now embedded into the $(z_{12}-z_{22}*z_{21}^{-1}*z_{11})^{-1}$ factors. Since $z_{12}$ (the largest part of the expression, at least near the center frequency) mainly represents the transformation of a current into a voltage over a quarter-wave line, this entails a 90° phase shift at the center frequency.

This means that the filter blocks $H_{11}$, $H_{12}$ and $H_{22}$ in the filter network 690 of FIG. 6 may be represented by:

$$H_{11} = \frac{V_{max}}{\alpha} z_{11}^{-1} \tag{15-17}$$

$$H_{12} = \frac{V_{max}(1-\alpha)}{\alpha}(z_{12} - z_{11} * z_{22} * z_{21}^{-1})^{-1} * z_{22} * z_{21}^{-1}$$

$$H_{22} = \frac{V_{max}(1-\alpha)}{\alpha}(z_{12} - z_{11} * z_{22} * z_{21}^{-1})^{-1}$$

In the realization of FIG. 6, the linearly compensated output signals of the filter network 690 are used as input to the filter network 660. The filter network 660 co-operates with the non-linear models 670, 675 for generating the compensation currents required to compensate for the non-linear part of the parasitics. These compensation currents are finally merged with delayed versions of the linearly compensated output signals of the filter network 690 in order to cancel the effects of the non-linear part of the parasitics. In this way, large-scale Doherty-specific distortion components such as the non-linear output current of the auxiliary amplifier is linearly compensated based on a linear model of the output network, while the residual distortion caused by the non-linear part of the parasitics is compensated based on respective non-linear models of the parasitics. The result will be a composite amplifier with excellent linearity and optimized efficiency.

The proposed linearization techniques effectively remove the traditional trade-off between linearity and efficiency of Doherty-type amplifiers, since they can simultaneously optimize linearity and efficiency. Furthermore, they are capable of optimizing linearity and efficiency over large bandwidths with retained performance. The possibility of wider relative bandwidths and higher efficiency enables the use of composite amplifiers in previously unattainable areas. For example, the wider relative bandwidths makes it possible to use the Doherty technique for radio systems at lower frequency, or to make high-efficiency amplifiers for entire system bandwidths instead of smaller chunks or individual channels. Even if a smaller range of bandwidth is actually used, the invention enables the making of a unified amplifier with flexible placement of the used bandwidth or channel within a much larger bandwidth. This implies a lower manufacturing cost, since fewer variants have to be manufactured.

Sometimes it can be useful to design reduced variants of the proposed composite amplifier, with simplified filter network configurations. For example, when the voltage at the output node of the main amplifier has an equalized frequency response due to the proposed equalization, the linear output network model can be simplified to the extent that the ideal voltage at the output node of the main amplifier can be described by a simple combination of the input signal x and f2(x). In practice, this means that the filters $G_{11}$ and $G_{12}$ (models of the impedance $z_{11}$ and the transimpedance $z_{12}$) are not needed when calculating the ideal output node voltages. In addition, in all cases where the non-linear drive function f2(x) should not be seen a priori knowledge can also be used to reduce the number of filters. All paths that go from f2(x) to the input of non-linear model of the lower branch can actually be removed. These two ideas can be combined as illustrated in FIG. 7, with significantly reduced complexity as a result.

Figure 7:
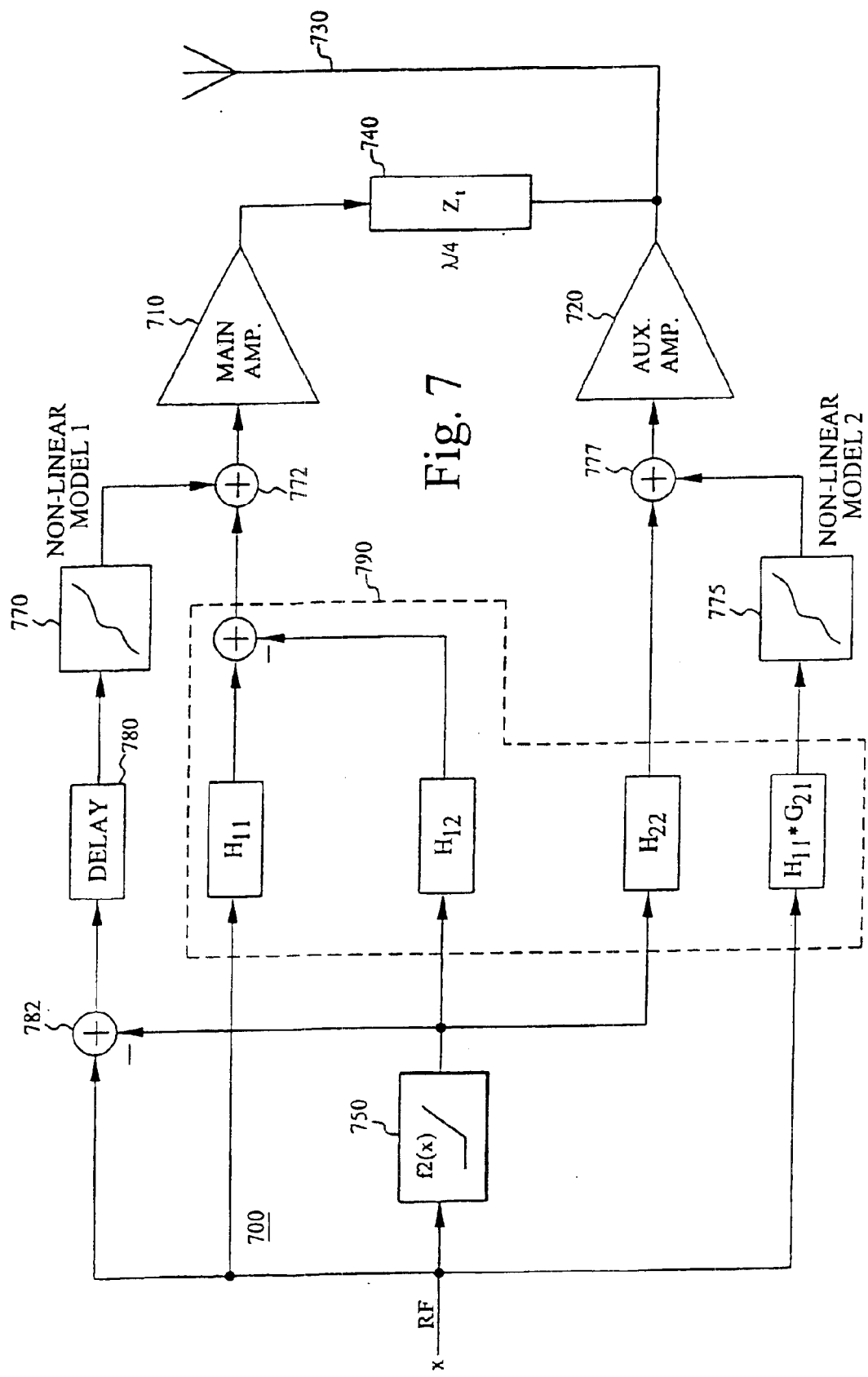
FIG. 7 is a schematic block diagram of a favorable, simplified implementation of a composite amplifier according to the currently most preferred embodiment of the invention.

FIG. 7 is a schematic block diagram of a favorable, simplified implementation of a composite amplifier according to the currently most preferred embodiment of the invention. The composite amplifier 700 comprises a main amplifier 710, an auxiliary amplifier 720, an antenna load 730, an impedance inverter 740, an input drive arrangement 750 for the auxiliary amplifier, suitable non-linear models of parasitics 770, 775, a delay block 780 and a filter network 790. As can be seen, the filter network 790 has a much simpler configuration than the combination of the filter networks 660 and 690 in the composite amplifier of FIG. 6. The filter blocks $H_{11}$, $H_{12}$ and $H_{22}$ are defined according to expressions (15–17) to provide cancellation of distortion and to provide an equalized frequency response. Due to the equalized frequency response of the output of the main amplifier, the ideal output node voltage of the main amplifier can be determined as a simple combination of the input signal x and f2(x) by using the adder element 782.

The resulting signal is delayed by the delay block 780 to synchronize the non-filtered path to the filtered paths, and subsequently applied to the non-linear model 770 to generate the appropriate compensation current. The compensation current is finally merged with the linearly compensated signal from the filter network 790 in the adder element 772 to generate an equalized and fully compensated input signal to the main amplifier 710. The convolution of the filter blocks $H_{11}$ and $G_{21}$ is now treated as a single filter $H_{11}*G_{21}$, which determines the ideal output node voltage of the auxiliary amplifier in response to the input signal x. The determined ideal output node voltage is then applied to the non-linear model 775 for generating the appropriate compensation current. This compensation current is finally merged with the linearly compensated signal from the filter block $H_{22}$ in the adder element 777 to provide an equalized and fully compensated input signal to the auxiliary amplifier 720. The example illustrated in FIG. 7 shows that, for some of the most important cases, a specific implementation can be very simplified compared to the more general solution of FIG. 6.

Although the filter networks described above with reference to FIGS. 5–7 may seem complicated, since they are assembled from many frequency-dependent impedances and transimpedances, the filter complexity can be reduced in several ways. In a digital implementation, the filters can be assembled from measured impedances by multiplication and division in the frequency domain. The thereby assembled filters can then either be used directly for filtering in the frequency domain, or be converted to time-domain filters. A frequency-domain window can be applied for restricting the filters to suitable bandwidths. Typically, filters are implemented as FIR (Finite Impulse Response) filters for flexibility.

In practice, the performance of the described techniques will depend on how well the characteristics of the Doherty output network are known. Measuring trans-impedances in the output network is often hard to do directly, since the (RF) voltage probe and the current injector will always have parasitics that must be taken into account. Indirectly, impedance parameters (Z-parameters) can be extracted by traveling wave measurements (S-parameters). A combination of different parameters that are easy to measure can also be selected. The required filters or emulating networks can then be designed using extracted impedances and transimpedances.

Many different implementations are possible. For example, digital or analog signal processing can be used, and the processing can be performed with a variety of techniques, at base-band, intermediate or final (RF) frequencies. Arbitrary combinations of these can be used, matching the requirements for a function with a convenient way of implementing it. The solutions can be used statically, optimized at the time of manufacture or at specific times during maintenance, or dynamically adaptive, for continuously optimizing the linearity and efficiency of the amplifier.

The invention can be used with the non-linear parts of the parasitics separated from an otherwise linear network as described above, or with the entire parasitics (including the linear as well as non-linear parts) separated. A further variety of this idea is to separate all conductive parasitics from the rest of the output network.

Although the invention has been described with reference to a two-stage Doherty-type composite amplifier, it is evident that the invention is applicable to composite amplifiers with more than two stages as well as to other types of composite amplifiers that share some or all of the described characteristics.

The embodiments described above are merely given as examples, and it should be understood that the present invention is not limited thereto. Further modifications, changes and improvements which retain the basic underlying principles disclosed and claimed herein are within the scope and spirit of the invention.

REFERENCES

[1] F. H. Raab, "Efficiency of Doherty RF Power Amplifier Systems", IEEE Trans. Broadcasting, vol. BC-33, no. 3, pp. 77–83, September, 1987.
[2] U.S. Pat. No. 5,420,541.
[3] U.S. Pat. No. 5,568,086.
[4] U.S. Pat. No. 5,786,727.
[5] U.S. Pat. No. 5,025,225.
[6] D. M. Upton et al. "A New Circuit Topology to Realize High Efficiency, High Linearity, and High Power Microwave Amplifiers", IEEE Proc. RAWCON'98.
[7] The International Patent Application WO 97/20385.
[8] U.S. Pat. No. 4,999,585.

What is claimed is:

1. A linearization method for a composite amplifier having at least two sub-amplifiers, said method comprising:
    for at least one sub-amplifier:
        determining a sub-amplifier output signal based on a linear model of the output network of the composite amplifier; and
        emulating and compensating for, in the input signal to the sub-amplifier, a non-linear amplifier behavior based on a non-linear model of a sub-amplifier parasitic using the determined sub-amplifier output signal as input to the model.

2. The linearization method according to claim 1, wherein said emulating step includes the step of determining a compensation signal according to the non-linear model by applying the determined sub-amplifier output signal as input to the non-linear model; and
    said compensating step includes the step of merging the compensation signal into the sub-amplifier input signal to compensate for said non-linear amplifier behavior.

3. The linearization method according to claim 1, wherein said step of determining a sub-amplifier output signal is based at least partly on an interaction between two sub-amplifiers.

4. The linearization method according to claim 3, wherein said interaction is represented by a transimpedance between the two sub-amplifiers.

5. The linearization method according to claim 1, wherein said non-linear amplifier behavior is the compression behavior due to amplifier saturation, said compression behavior being modeled as a non-linear sub-amplifier parasitic.

6. The linearization method according to claim 1, wherein said steps of determining a sub-amplifier output signal and emulating and compensating for a non-linear amplifier behavior are performed for each sub-amplifier.

7. The linearization method according to claim 1, wherein said method further comprises steps of emulating and compensating for, in the input signal to a main sub-amplifier, the non-linear output signal of an auxiliary sub-amplifier based on a linear model of the output network of the composite amplifier.

8. The linearization method according to claim 1, wherein said method further comprises the steps of equalizing, for at least one of said sub-amplifiers, the amplifier frequency response.

9. A composite amplifier having at least two sub-amplifiers, wherein said composite amplifier comprises:
    for at least one sub-amplifier:
        means for determining a sub-amplifier output signal based on a linear model of the output network of the composite amplifier;
        means for emulating and compensating for, in the input signal to the sub-amplifier, a non-linear amplifier behavior based on a non-linear model of a sub-amplifier parasitic using the determined sub-amplifier output signal as input to the model.

10. The composite amplifier according to claim 9, wherein said emulating means includes means for determining a compensation signal according to the non-linear model in response to the determined sub-amplifier output signal as input to the non-linear model; and
    said compensating means includes means for merging the compensation signal into the sub-amplifier input signal to compensate for said non-linear amplifier behavior.

11. The composite amplifier according to claim 9, wherein said means for determining a sub-amplifier output signal is based at least partly on an interaction between two sub-amplifiers.

12. The composite amplifier according to claim 11, wherein said interaction is represented by a transimpedance between the two sub-amplifiers.

13. The composite amplifier according to claim 9, wherein said composite amplifier further comprises means for emulating and compensating for, in the input signal to a main sub-amplifier, the non-linear output signal of an auxiliary sub-amplifier based on a linear model of the output network of the composite amplifier.

14. The composite amplifier according to claim 9, wherein said composite amplifier further comprises, for at least one of said sub-amplifiers, means for equalizing the amplifier frequency response.

15. A transmitter having a composite power amplifier based on at least two sub-amplifiers, wherein said composite power amplifier comprises:
    for at least one sub-amplifier:
        means for determining a sub-amplifier output signal based on a linear model of the output network of the composite amplifier;
        means for emulating and compensating for, in the input signal to the sub-amplifier, a non-linear amplifier behavior based on a non-linear model of a sub-amplifier parasitic using the determined sub-amplifier output signal as input to the model.

16. The transmitter according to claim 15, wherein said emulating means includes means for determining a compensation signal according to the non-linear model in response to the determined sub-amplifier output signal as input to the non-linear model; and
    said compensating means includes means for merging the compensation signal into the sub-amplifier input signal to compensate for said non-linear amplifier behavior.

17. The transmitter according to claim 15, wherein said means for determining, for at least one sub-amplifier, a sub-amplifier output signal is based at least partly on an interaction between two sub-amplifiers.

18. The transmitter according to claim 17, wherein said interaction is represented by a transimpedance between the two sub-amplifiers.

19. The transmitter according to claim 15, wherein said composite power amplifier further comprises means for emulating and compensating for, in the input signal to a main sub-amplifier, the non-linear output signal of an auxiliary sub-amplifier based on a linear model of the output network of the composite amplifier.

20. The transmitter according to claim 15, wherein said composite power amplifier further comprises means for equalizing, for at least one of said sub-amplifiers, the amplifier frequency response.

* * * * *